United States Patent
Wada et al.

(10) Patent No.: US 6,664,196 B1
(45) Date of Patent: Dec. 16, 2003

(54) METHOD OF CLEANING ELECTRONIC DEVICE AND METHOD OF FABRICATING THE SAME

(75) Inventors: Yukihisa Wada, Kyoto (JP); Michikazu Matsumoto, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/526,174

(22) Filed: Mar. 15, 2000

(30) Foreign Application Priority Data

Mar. 15, 1999 (JP) ............................. 11-067976

(51) Int. Cl.⁷ ............................................ H01L 21/302
(52) U.S. Cl. ....................................... 438/754; 438/745
(58) Field of Search ................. 438/199, 689, 438/745, 754, 656

(56) References Cited

U.S. PATENT DOCUMENTS

| | | | | |
|---|---|---|---|---|
| 4,242,698 A | * | 12/1980 | Ghate et al. .................... 357/71 |
| 4,917,759 A | * | 4/1990 | Fisher et al. ................ 156/643 |
| 5,173,152 A | | 12/1992 | Tanaka | |
| 5,626,681 A | * | 5/1997 | Nakano et al. ................ 134/3 |
| 5,677,237 A | * | 10/1997 | Tsai et al. .................... 280/607 |
| 5,855,811 A | * | 1/1999 | Grieger et al. ............. 252/79.3 |
| 5,904,560 A | * | 5/1999 | Brumley ..................... 438/639 |
| 5,930,613 A | * | 7/1999 | Schlais et al. .............. 438/201 |
| 5,946,595 A | * | 8/1999 | Doan et al. .................. 438/659 |
| 5,972,123 A | * | 10/1999 | Verhaverbeke ................. 134/3 |
| 6,017,809 A | * | 1/2000 | Inumiya et al. ............. 438/585 |
| 6,107,165 A | * | 8/2000 | Jain et al. .................... 438/467 |
| 6,149,828 A | * | 11/2000 | Vaartstra ........................ 216/57 |
| 6,156,629 A | * | 12/2000 | Tao et al. .................... 438/535 |
| 6,178,972 B1 | | 1/2001 | Harada et al. | |

FOREIGN PATENT DOCUMENTS

| | | |
|---|---|---|
| JP | 05-029292 | 2/1993 |
| JP | 08-008231 | 1/1996 |
| JP | 08-088198 | 4/1996 |
| JP | 08-162425 | 6/1996 |
| JP | 09-022947 | 1/1997 |
| JP | 09-074080 | 3/1997 |
| JP | 9-266178 | 10/1997 |
| JP | 09-275148 | 10/1997 |
| JP | 10-183185 | 7/1998 |
| JP | 10-340908 | 12/1998 |
| JP | 11-097400 | 4/1999 |
| JP | 11-243085 | 9/1999 |
| JP | 2000-36479 | 2/2000 |

OTHER PUBLICATIONS

Notice of Reasons of Rejection, Patent Application No. 2000–068282 Mailing Date: Nov. 13, 2001, Reference No. 2926410187, Mailing No. 548928, (English Translation).

Monthly Semiconductor World, pp. 76–81, Sep. 1998 (and a partial English Translation thereof).

Wolf, S.; Silicon Processing for the VLSI Era vol. 2: Process Integration, Sunset Beach, CA, 1990, pp. 192–193, 247–251.*

Morita et al.: Advanced UCT Cleaning Process Based on Specific Gasses Dissolved Ultrapure Water, IEEE, Jun., 1999, p. 453–456.*

* cited by examiner

*Primary Examiner*—John F. Niebling
*Assistant Examiner*—Christopher Lattin
(74) *Attorney, Agent, or Firm*—Nixon Peabody LLP; Donald R. Studebaker

(57) ABSTRACT

An electronic device having a component containing a refractory metal such as tungsten is cleaned by using a cleaning solution composed of an acidic solution which does not substantially contain aqueous hydrogen peroxide or an alkaline solution which does not substantially contain aqueous hydrogen peroxide.

8 Claims, 4 Drawing Sheets

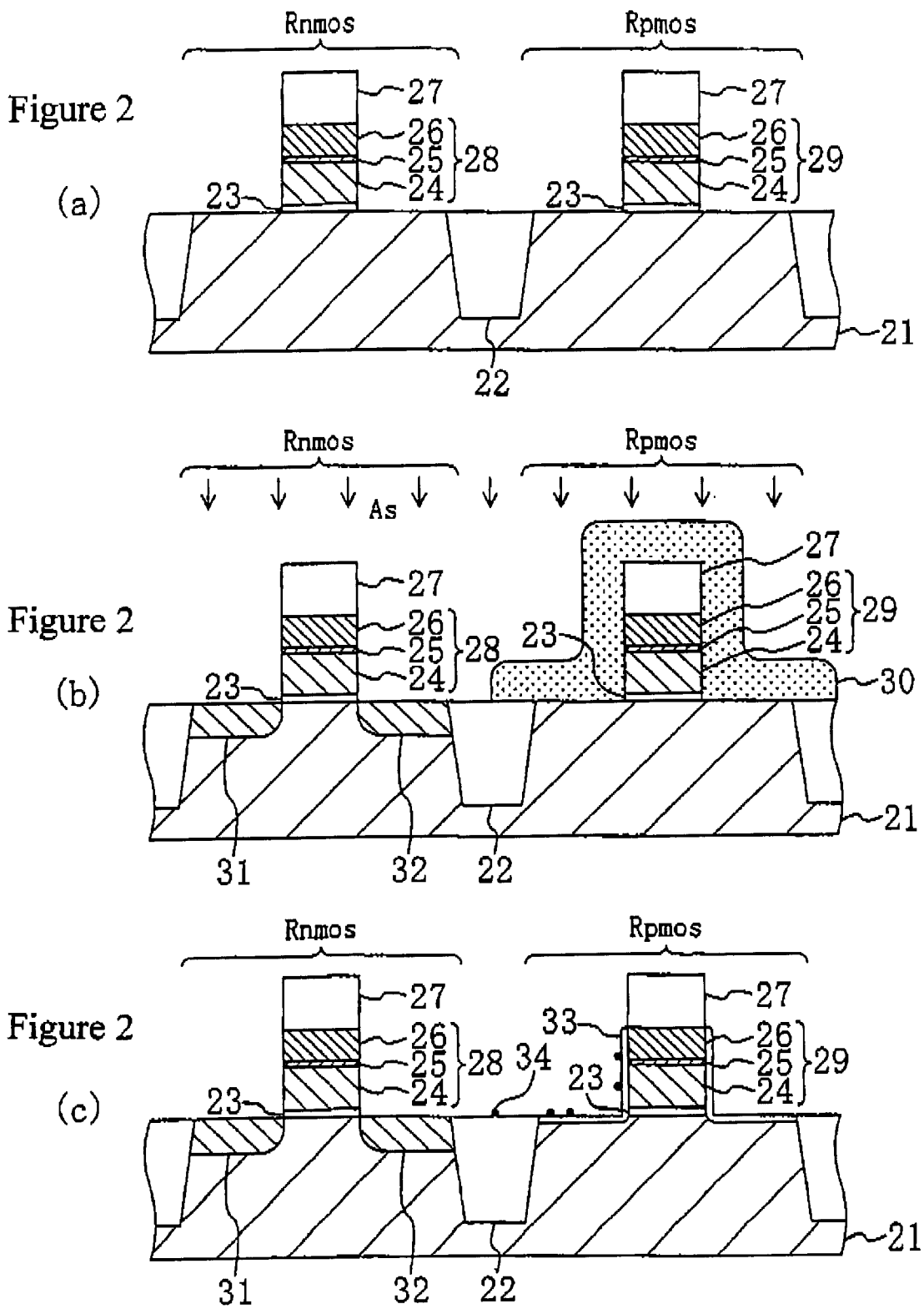

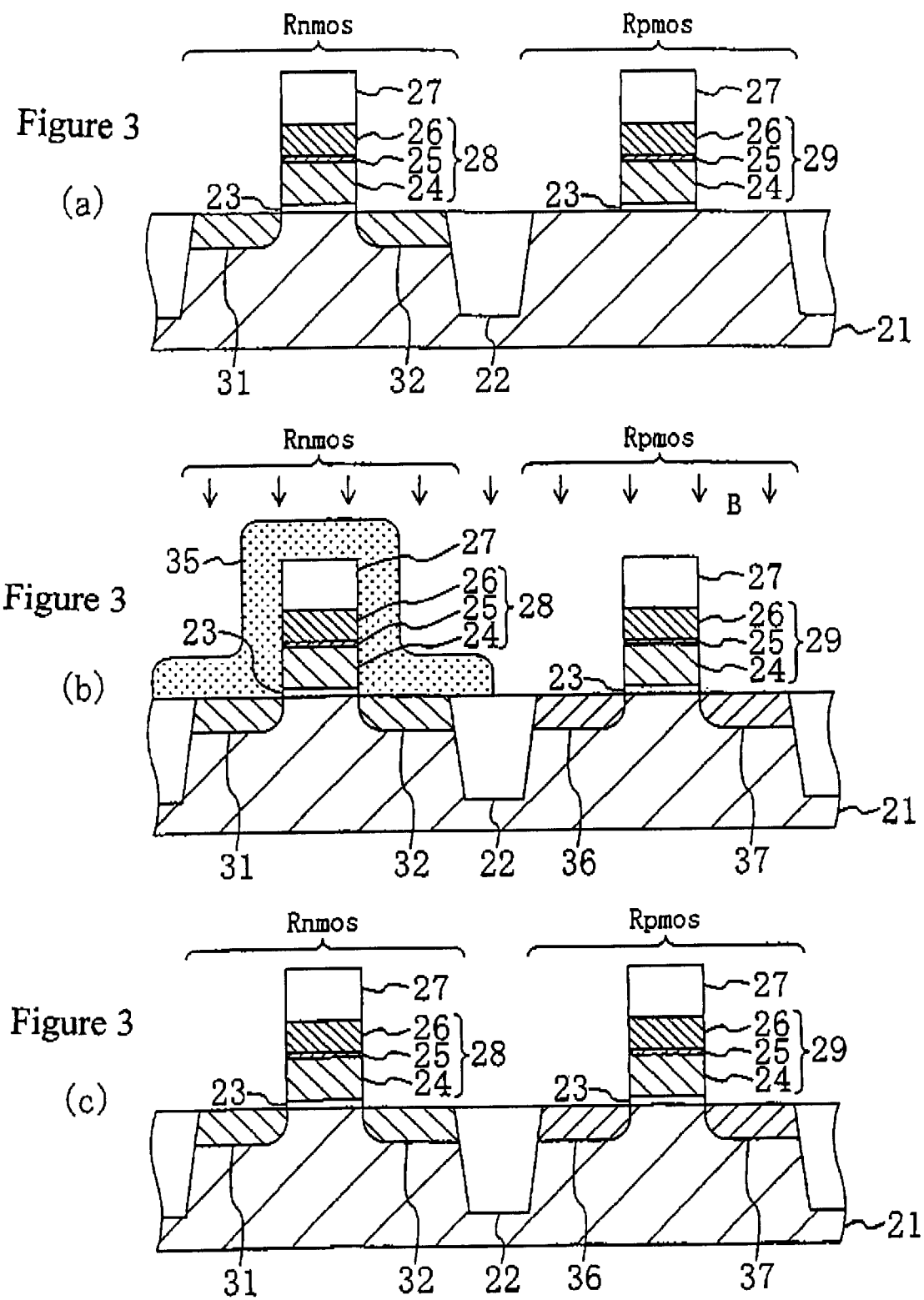

METHOD OF CLEANING ELECTRONIC DEVICE AND METHOD OF FABRICATING THE SAME

BACKGROUND OF THE INVENTION

The present invention relates to a method of cleaning an electronic device having a component containing a refractory metal such as tungsten (W) and to a method of fabricating the same. More particularly, it relates to a method of cleaning an electronic device having a polymetal gate electrode structure (such as W/WN$_x$/Poly-Si) or a metal gate electrode structure (such as W/WN$_x$) for reducing the resistance of the gate electrode of a MOS transistor and to a method of fabricating the same.

In recent years, increasing miniaturization, higher integration density, higher-speed operation, and lower power consumption has been required of a VLSI device.

In the process of fabricating a VLSI device, the operating speed of the VLSI device is further increased by reducing the resistance of the gate electrode of a MOS transistor. To reduce the resistance of the gate electrode of the MOS transistor, there has been developed a polymetal gate electrode or metal gate electrode using a metal not containing silicon, specifically a refractory metal, as a replacement of a conventional polysilicon gate electrode or silicide gate electrode.

As an exemplary structure of the polymetal gate electrode, a structure in which W/WN$_x$/Poly-Si is deposited on a gate oxide film or a structure in which W/TiN/Poly-Si is deposited on a gate oxide film has been used.

As an exemplary structure of the metal gate electrode, a structure in which W/WN$_x$ is deposited on a gate oxide film or a structure in which W/TiN is deposited on a gate oxide film has been used.

As the refractory metal composing the polymetal gate electrode or metal gate electrode, tungsten has been used predominantly (Monthly Semiconductor World, pp.76–81, 1998, 9).

In cleaning an electronic device having a conventional polysilicon gate electrode or silicide gate electrode, a cleaning solution which is a mixture of an acidic or alkaline solution and aqueous hydrogen peroxide ($H_2O_2$) has been used predominantly to remove a particle (having a diameter of about 10 μm or less), resist residue, a polymer, or a metal. Such a method of cleaning an electronic device is generally known as an RCA cleaning method.

However, if an electronic device having a polymetal gate electrode, metal gate electrode, or the like containing a refractory metal such as tungsten is cleaned by such a conventional cleaning method as the RCA cleaning method, tungsten or the like composing the gate electrode is dissolved disadvantageous, so that the reliability of the electronic device is reduced.

SUMMARY OF THE INVENTION

In view of the foregoing, it is an object of the present invention to ensure cleaning of an electronic device, while preventing the dissolution of a refractory metal such as tungsten contained in a component of the electronic device.

The present inventors have examined the cause of the dissolution of tungsten contained in the component of the electronic device when a conventional cleaning method is used.

Referring to FIGS. 4(a) to 4(c), a description will be given to the case of forming a polymetal gate electrode containing tungsten on a substrate and then cleaning the substrate in accordance with the conventional cleaning method. In the present specification, a substrate formed with a component such as a gate electrode will be termed an electronic device.

First, as shown in FIG. 4(a), a gate oxide film 2 is formed by thermal oxidation on a silicon substrate 1. Then, a polysilicon (Poly-Si) film 3A, a tungsten nitride (WN$_x$) film 3B, and a tungsten film 3C as the materials of a polymetal gate electrode are deposited successively on the gate oxide film 2, followed by a silicon nitride film 4 deposited on the tungsten film 3C. Subsequently, dry etching is performed successively with respect to the silicon nitride film 4, the tungsten film 3C, the tungsten nitride film 3B, and the polysilicon film 3A by using a resist pattern (not shown) covering a region in which a gate electrode is to be formed as a mask, thereby forming a polymetal gate electrode 3 composed of the polysilicon film 3A, the tungsten nitride film 3B, and the tungsten film 3C on the silicon substrate 1 with the gate oxide film 2 interposed therebetween. Thereafter, the resist pattern is removed by ashing.

Next, the silicon substrate 1 is cleaned by sequentially using a first cleaning solution composed of a SPM solution (a solution mixture of sulfuric acid ($H_2SO_4$) and aqueous hydrogen peroxide) and a second cleaning solution composed of an APM solution (a solution mixture of aqueous ammonium ($NH_4OH$), aqueous hydrogen peroxide, and water).

During the cleaning process, as shown in FIG. 4(b), the tungsten nitride film 3B and the tungsten film 3C, each composing the polymetal gate electrode 3, are etched in a direction parallel to the silicon substrate 1.

The present inventors tried cleaning the silicon substrate 1 by increasing the respective concentrations of aqueous hydrogen peroxide contained in the SPM solution and in the APM solution.

As a result, as shown in FIG. 4(c), the tungsten nitride film 3B and the tungsten film 3C, each composing the polymetal gate electrode 3, were entirely dissolved to disappear.

This proves that aqueous hydrogen peroxide contained in the conventional cleaning solution is the cause of the dissolution of tungsten contained in the component of the electronic device.

The present inventors also assumed the formula representing the chemical reaction between tungsten and aqueous hydrogen peroxide to be

W+2H$_2$O$_2$→WO$_2$+2H$_2$O (Oxidation of Tungsten)

2WO$_2$+6H$_2$O$_2$→H$_2$W$_2$O$_{11}$+5H$_2$O (Dissolution of Tungsten)

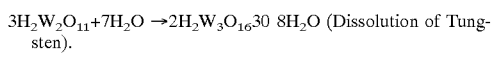

3H$_2$W$_2$O$_{11}$+7H$_2$O →2H$_2$W$_3$O$_{16}$30 8H$_2$O (Dissolution of Tungsten).

It may be considered that, if the electronic device having the component containing tungsten is cleaned with the cleaning solution containing aqueous hydrogen peroxide, the chemical reaction proceeds catalytically between tungsten and aqueous hydrogen peroxide in accordance with the foregoing chemical reaction formula, so that tungsten contained in the component of the electronic device is dissolved.

The present invention has been achieved based on the foregoing findings. Specifically, a first method of cleaning an electronic device according to the present invention comprises the step of: cleaning an electronic device having a component containing tungsten by using a cleaning solution composed of an acidic solution which does not substantially contain aqueous hydrogen peroxide or an alkaline solution which does not substantially contain aqueous hydrogen peroxide.

In accordance with the first cleaning method, the electronic device is cleaned by using the cleaning solution composed of the acidic solution which does not substantially contain aqueous hydrogen peroxide or the alkaline solution which does not substantially contain aqueous hydrogen peroxide. Compared with the case where a cleaning solution containing aqueous hydrogen peroxide is used, the etching rate for tungsten can be reduced significantly and particles, resist residue, a polymer, or the like can be removed thoroughly. This ensures cleaning of the electronic device, while preventing the dissolution of tungsten contained in a component of the electronic device.

In the present specification, the cleaning solution which does not substantially contain aqueous hydrogen peroxide is defined as a cleaning solution which contains aqueous hydrogen peroxide (at a concentration of 30wt %) at a volume ratio of less than about 0.2%.

In the first cleaning method, the cleaning solution is preferably a solution mixture of tetramethyl ammonium hydroxide and water.

In the arrangement, the etching rate for tungsten can be reduced significantly compared with the case where a cleaning solution containing aqueous hydrogen peroxide is used and particles, resist residue, a polymer, or the like can be removed thoroughly.

In this case, if a concentration of tetramethyl ammonium hydroxide in the solution mixture is adjusted to be in the range of 0.01 to 5.0wt %, the foregoing effects are achieved positively.

In the first cleaning method, the cleaning solution is preferably ozone-containing water.

In the arrangement, the etching rate for tungsten can be reduced significantly compared with the case where a cleaning solution containing aqueous hydrogen peroxide is used and particles, resist residue, a polymer, or the like can be removed thoroughly.

In this case, if a concentration of ozone in the ozone-containing water is adjusted to be in the range of 0.1 to 100 ppm, the foregoing effects are achieved positively.

In the first cleaning method, the cleaning solution is preferably aqueous ammonia.

In the arrangement, the etching rate for tungsten can be reduced significantly compared with the case where a cleaning solution containing aqueous hydrogen peroxide is used and particles, resist residue, a polymer, or the like can be removed thoroughly.

In this case, if a concentration of ammonia in the aqueous ammonia is adjusted to be in the range of 0.1 to 5.0wt %, the foregoing effects are achieved positively.

In this case, if ozone is added to the aqueous ammonia, the foregoing effects are achieved more positively.

In the first cleaning method, the cleaning solution is preferably a solution mixture of hydrofluoric acid or sulfuric acid and water.

In the arrangement, the etching rate for tungsten can be reduced significantly compared with the case where a cleaning solution containing aqueous hydrogen peroxide is used and particles, resist residue, a polymer, or the like can be removed thoroughly.

In this case, if ozone is added to the solution mixture, the foregoing effects are achieved more positively.

A second method of cleaning an electronic device according to the present invention comprises the step of: cleaning an electronic device having a component containing tungsten by sequentially using two or more of a solution mixture of tetramethyl ammonium hydroxide and water, ozone-containing water, aqueous ammonia, aqueous ammonia containing ozone, a solution mixture of hydrofluoric acid and water, a solution mixture of hydrofluoric acid and water containing ozone, a solution mixture of sulfuric acid and water, and a solution mixture of sulfuric acid and water containing ozone.

In accordance with the second cleaning method, the electronic device is cleaned by sequentially using two or more of the solution mixture of tetramethyl ammonium hydroxide and water, the ozone-containing water, the aqueous ammonia, the aqueous ammonia containing ozone, the solution mixture of hydrofluoric acid and water, the solution mixture of hydrofluoric acid and water containing ozone, the solution mixture of sulfuric acid and water, and the solution mixture of sulfuric acid and water containing ozone. Compared with the case where a cleaning solution containing aqueous hydrogen peroxide is used, the etching rate for tungsten can be reduced significantly and particles, resist residues, a polymer, or the like can be removed thoroughly. This ensures cleaning of the electronic device, while preventing the dissolution of tungsten contained in a component of the electronic device.

A third method of cleaning an electronic device according to the present invention comprises the step of: cleaning an electronic device having a component containing tungsten by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water.

In accordance with the third cleaning method, the electronic device is cleaned by sequentially using the first cleaning solution composed of the solution mixture of hydrofluoric acid and water (hereinafter referred to as a DHF solution), the second cleaning solution composed of the ozone-containing water (hereinafter referred to as aqueous $O_3$), and the third cleaning solution composed of the solution mixture of tetramethyl ammonium hydroxide and water (hereinafter referred to as a TMAH solution). Compared with the case where a cleaning solution containing aqueous hydrogen peroxide is used, the etching rate for tungsten can be reduced significantly and particles, resist residue, a polymer, or the like can be removed thoroughly. This ensures cleaning of the electronic device, while preventing the dissolution of tungsten contained in a component of the electronic device.

A first method of fabricating an electronic device according to the present invention comprises the steps of: forming, on a substrate, a multilayer film including at least a refractory metal film; performing dry etching with respect to the multilayer film by using a mask pattern covering a gate electrode formation region of a first-conductivity-type transistor formation region and thereby forming a gate electrode composed of the multilayer film; implanting a second-conductivity-type impurity into the first-conductivity-type transistor formation region by using a resist pattern covering a second-conductivity-type transistor formation region and the gate electrode as a mask; and removing the resist pattern by ashing and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water.

In accordance with the first fabrication method, the substrate formed with the gate electrode is cleaned by sequentially using the first cleaning solution composed of the DHF solution, the second cleaning solution composed of the aqueous $O_3$, and the third cleaning solution composed of the TMAH solution. Compared with the case where a cleaning solution containing aqueous hydrogen peroxide is used, the etching rate for a refractory metal can be reduced significantly and particles, resist residue, a polymer, or the like can be removed thoroughly. This ensures cleaning of the substrate, while preventing the dissolution of a refractory metal contained in the gate electrode, thereby providing an electronic device with high reliability.

Moreover, since the first fabrication method removes particles, resist residue, a polymer, or the like together with the oxide film formed on the substrate or on the refractory metal film under the lift-off effect or the like exerted by the cleaning process using the DHF solution (first cleaning solution), forms an oxide film for preventing the production of stains (water marks) on the substrate by the cleaning process using the aqueous $O_3$ (second cleaning solution), and removes remaining microfine particles by the cleaning process using the TMAH solution (third cleaning solution), the reliability of the electronic device is further improved.

A second method of fabricating an electronic device according to the present invention comprises the steps of: forming a refractory metal film on a substrate; performing dry etching with respect to the refractory metal film by using a resist pattern covering a gate electrode formation region and thereby forming a gate electrode composed of the refractory metal film; and removing the resist pattern by ashing and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water.

In accordance with the second fabrication method, the substrate formed with the gate electrode is cleaned by sequentially using the first cleaning solution composed of the DHF solution, the second cleaning solution composed of the aqueous $O_3$, and the third cleaning solution composed of the TMAH solution. Compared with the case where a cleaning solution containing aqueous hydrogen peroxide is used, the etching rate for a refractory metal can be reduced significantly and particles, resist residue, a polymer, or the like can be removed thoroughly. This ensures cleaning of the substrate, while preventing the dissolution of a refractory metal contained in the gate electrode, thereby providing an electronic device with high reliability.

Moreover, since the second fabrication method removes particles, resist residue, a polymer, or the like together with the oxide film formed on the substrate or on the refractory metal film under the lift-off effect or the like exerted by the cleaning process using the DHF solution (first cleaning solution), forms an oxide film for preventing the production of stains (water marks) on the substrate by the cleaning process using the aqueous $O_3$ (second cleaning solution), and removes remaining microfine particles by the cleaning process using the TMAH solution (third cleaning solution), the reliability of the electronic device is further improved.

In the first or second fabrication method, the gate electrode preferably has a polymetal gate electrode structure or a metal gate electrode structure.

This allows the formation of an electronic device having a high-performance polymetal gate electrode or metal gate electrode.

A third method of fabricating an electronic device according to the present invention comprises the steps of: forming a first electrode structure and a second electrode structure on a first-conductivity-type MOSFET formation region and a second-conductivity-type MOSFET formation region of a substrate, respectively; implanting a second-conductivity-type impurity into the first-conductivity-type MOSFET formation region by using, as a mask, a first resist pattern covering the second-conductivity-type MOSFET formation region including the second electrode structure and the first electrode structure to form a first source region and a first drain region in the first-conductivity-type MOSFET formation region; removing the first resist pattern by ashing using an oxygen plasma and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water; implanting a first-conductivity-type impurity into the second-conductivity-type MOSFET formation region by using, as a mask, a second resist pattern covering the first-conductivity-type MOSFET formation region including the first electrode structure and the second electrode structure to form a second source region and a second drain region in the second-conductivity-type MOSFET formation region; and removing the second resist pattern by ashing using an oxygen plasma and cleaning the substrate by sequentially using the first cleaning solution composed of the solution mixture of hydrofluoric acid and water, the second cleaning solution composed of the ozone-containing water, and the third cleaning solution composed of the solution mixture of tetramethyl ammonium hydroxide and water, each of the first and second electrode structures having a multilayer structure composed of a polysilicon film and a refractory metal film.

In accordance with the third fabrication method, the substrate formed with the electrode structures is cleaned by sequentially using the first cleaning solution composed of the DHF solution, the second cleaning solution composed of the aqueous $O_3$, and the third cleaning solution composed of the TMAH solution. Compared with the case where a cleaning solution containing aqueous hydrogen peroxide is used, the etching rate for a refractory metal can be reduced significantly and particles, resist residue, a polymer, or the like can be removed thoroughly. This ensures cleaning of the substrate, while preventing the dissolution of a refractory metal contained in the electrode structures, thereby providing an electronic device with high reliability.

Moreover, since the third fabrication method removes particles, resist residue, a polymer, or the like together with the oxide film formed on the substrate or on the refractory metal film under the lift-off effect or the like exerted by the cleaning process using the DHF solution (first cleaning solution), forms an oxide film for preventing the production of stains (water marks) on the substrate by the cleaning process using the aqueous $O_3$ (second cleaning solution), and removes remaining microfine particles by the cleaning process using the TMAH solution (third cleaning solution), the reliability of the electronic device is further improved.

A fourth method of fabricating an electronic device according to the present invention comprises the steps of: forming a first electrode structure and a second electrode structure on a first-conductivity-type MOSFET formation region and a second-conductivity-type MOSFET formation region of a substrate, respectively; implanting a second-conductivity-type impurity into the first-conductivity-type MOSFET formation region by using, as a mask, a first resist pattern covering the second-conductivity-type MOSFET formation region including the second electrode structure and the first electrode structure to form a first source region and a first drain region in the first-conductivity-type MOSFET formation region; removing the first resist pattern by ashing using an oxygen plasma and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water; implanting a first-conductivity-type impurity into the second-conductivity-type MOSFET formation region by using, as a mask, a second resist pattern covering the first-conductivity-type MOSFET formation region including the first electrode structure and the second electrode structure to form a second source region and a second drain region in the second-conductivity-type MOSFET formation region; and removing the second resist pattern by ashing using an oxygen plasma and cleaning the substrate by sequentially using the first cleaning solution composed of the solution mixture of hydrofluoric acid and water, the second cleaning solution composed of the ozone-containing water, and the third cleaning solution composed of the solution mixture of tetramethyl ammonium hydroxide and water, each of the first and second electrode structures containing a metal.

In accordance with the fourth fabrication method, the substrate formed with the electrode structures is cleaned by sequentially using the first cleaning solution composed of the DHF solution, the second cleaning solution composed of the aqueous $O_3$, and the third cleaning solution composed of the TMAH solution. Compared with the case where a cleaning solution containing aqueous hydrogen peroxide is used, the etching rate for a metal can be reduced significantly and particles, resist residue, a polymer, or the like can be removed thoroughly. This ensures cleaning of the substrate, while preventing the dissolution of a metal contained in the electrode structures, thereby providing an electronic device with high reliability.

Moreover, since the fourth fabrication method removes particles, resist residue, a polymer, or the like together with the oxide film formed on the substrate or on the metal film under the lift-off effect or the like exerted by the cleaning process using the DHF solution (first cleaning solution), forms an oxide film for preventing the production of stains (water marks) on the substrate by the cleaning process using the aqueous $O_3$ (second cleaning solution), and removes remaining microfine particles by the cleaning process using the TMAH solution (third cleaning solution), the reliability of the electronic device is further improved.

BRIEF DESCRIPTION OF THE DRAWINGS

FIGS. 2(a) to 2(c) are cross-sectional views illustrating the individual process steps of a method of fabricating an electronic device according to a second embodiment;

FIGS. 3(a) to 3(c) are cross-sectional views illustrating the individual process steps of a method of fabricating an electronic device according to the second embodiment.

DETAILED DESCRIPTION OF THE INVENTION

Embodiment 1

Figure 1:
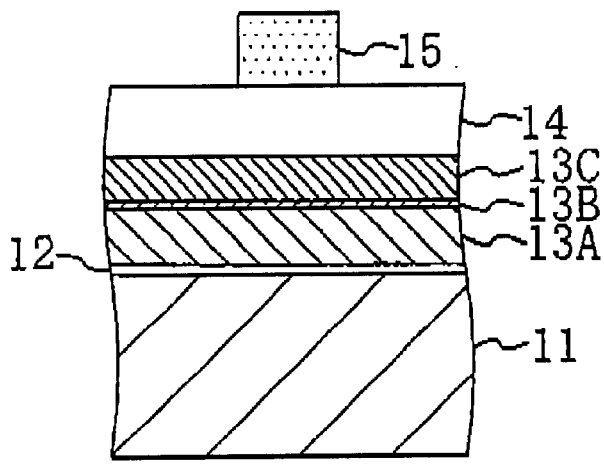
FIGS. 1(a) to 1(d) are cross-sectional views illustrating the individual process steps of a method of fabricating an electronic device according to a first embodiment.
Figure 1:
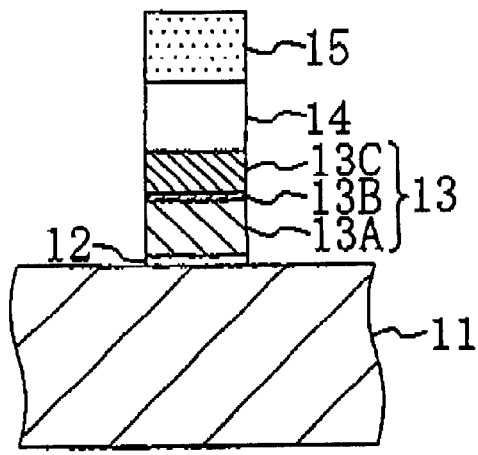
Figure 1:
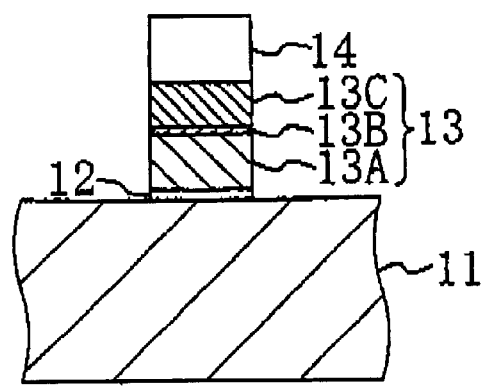
Figure 1:
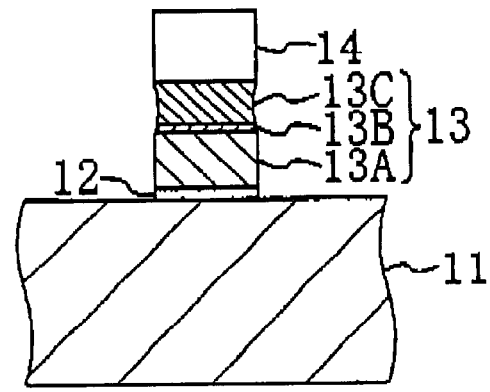
Figure 4A:
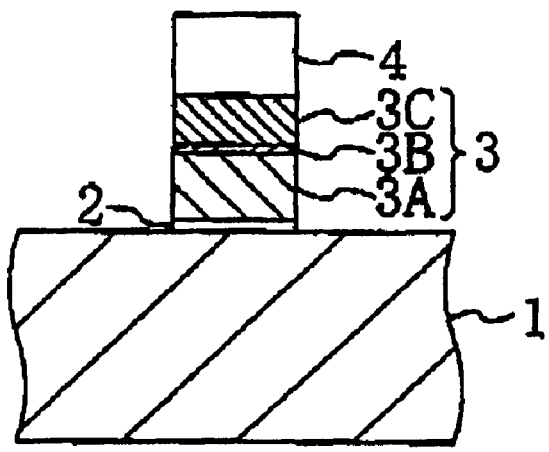
FIGS. 4(a) to 4(c) are cross-sectional views illustrating the individual process steps of a conventional method of fabricating an electronic device.
Figure 4B:
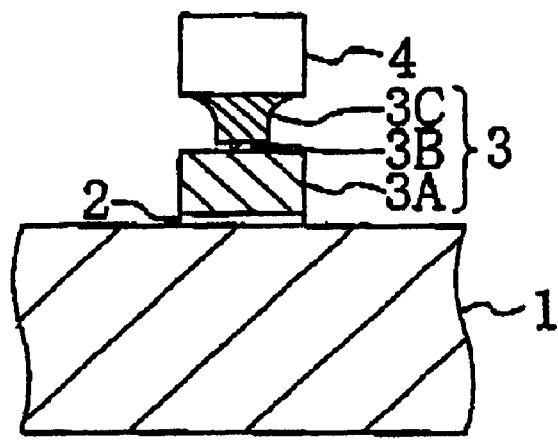
Figure 4C:
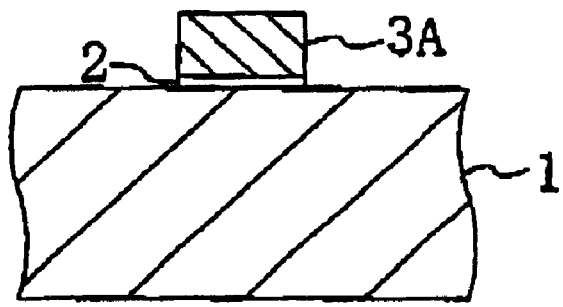

A method of cleaning an electronic device and a method of fabricating the same according to a first embodiment of the present invention will be described.

The first embodiment is characterized in that a substrate formed with a component containing a refractory metal such as tungsten, i.e., an electronic device is cleaned by using a cleaning solution composed of an acidic solution which does not substantially contain aqueous hydrogen peroxide or an alkaline solution which does not substantially contain aqueous hydrogen peroxide.

Solutions used as the cleaning solution in the first embodiment are a solution mixture (hereinafter referred to as a TMAH solution) of tetramethyl ammonium hydroxide ($(CH_3)_4NOH$) and water, ozone-containing water (hereinafter referred to as aqueous $O_3$), aqueous ammonia (hereinafter referred to as aqueous $NH_4OH$), and a solution mixture (hereinafter referred to as a DHF solution which is hydrofluoric acid diluted with water) of hydrofluoric acid and water.

Table 1 shows a first cleaning method of the first embodiment using the cleaning solution composed of the TMAH solution, a second cleaning method of the first embodiment using the cleaning solution composed of the aqueous $O_3$, a third cleaning method of the first embodiment using the cleaning solution composed of the aqueous $NH_4OH$, a fourth cleaning method of the first embodiment using the cleaning solution composed of the DHF solution, a fifth cleaning method of the first embodiment sequentially using a first cleaning solution composed of the DHF solution and a second cleaning solution composed of the aqueous $O_3$, a sixth cleaning method of the first embodiment sequentially using a first cleaning solution composed of the DHF solution, a second cleaning solution composed of the aqueous $O_3$, and a third cleaning solution composed of the TMAH solution, and a seventh cleaning method of a comparative example sequentially using a first cleaning solution composed of a SPM solution and a second cleaning solution composed of an APM solution.

TABLE 1

| No. | Cleaning solution and Concentration | Cleaning Temperature (° C.) | | Immersion Time in Cleaning Solution (min) |
|---|---|---|---|---|
| 1 | TMAH Solution; 2.0 wt % | Room Temperature | | 1 min |
| 2 | Aqueous $O_3$: 5.0 ppm | Room Temperature | | 3 min |
| 3 | Aqueous $NH_4OH$: 4.83 wt % | Room Temperature | | 2 min |
| 4 | DHF Solution: 0.0008 wt % | Room Temperature | | 2 min |
| 5 | DHF Solution: 0.0008 wt % | (DHF) Room Temperature | (DHF) | 2 min |
|  | Aqueous $O_3$: 5.0 ppm | ($O_3$) Room Temperature | ($O_3$) | 3 min |
| 6 | DHF Solution: 0.0008 wt % | (DHF) Room Temperature | (DHF) | 2 min |
|  | Aqueous $O_3$: 5.0 ppm | ($O_3$) Room Temperature | ($O_3$) | 3 min |
|  | TMAH Solution: 2.0 wt % | (TMAH) Room Temperature | (TMAH) | 1 min |

TABLE 1-continued

| No. | Cleaning solution and Concentration | Cleaning Temperature (° C.) | Immersion Time in Cleaning Solution (min) |
|---|---|---|---|
| 7 | SPM Solution: Containing 98% $H_2SO_4$ and 30% $H_2O_2$ at 1:4 Volume Ratio | (SPM) 80° C. | (SPM) 10 min |
|  | APM Solution: Containing 29% $NH_4OH$, 30% $H_2O_2$, and $H_2O$ at 1:1:5 Volume Ratio | (APM) 70° C. | (APM) 5 min |

In the first cleaning method of the first embodiment, the substrate is rinsed with pure water for 7 seconds, immersed in the TMAH solution containing tetramethyl ammonium hydroxide at a concentration of, e.g., 2.0 wt % for 1 minute at room temperature, as shown in Table 1, and then cleaned dried. The concentration of tetramethyl ammonium hydroxide in the TMAH solution is not limited to 2.0 wt % and preferably in the range of 0.01 to 5.0 wt %.

In the second cleaning method of the first embodiment, as shown in Table 1, the substrate is immersed in the aqeous $O_3$ containing ozone at a concentration of, e.g., 5.0 ppn for 3 minutes at room temperature and then clean dried. The concentration of ozone in the aqueous $O_3$ is not limited to 5.0 ppm and preferably in the range of 0.1 to 100 ppm.

In the third cleaning method of the first embodiment, as shown in Table 1, the substrate is immersed in the aqueous $NH_4OH$ containing ammonia at a concentration of, e.g., 4.83 wt % for 2 minutes at room temperature, rinsed with pure water for 5 minutes, and then clean dried. The concentration of ammonia in the aqueous $NH_4OH$ is not limited to 4.83 wt % and preferably in the range of 0.1 to 5.0 wt %.

In the fourth cleaning method of the first embodiment, as shown in Table 1, the substrate is immersed in the DHF solution containing hydrofluoric acid at a concentration of, e.g., 0.0008 wt % for 2 minutes at room temperature, rinsed with pure water for 5 minutes, and then clean dried. Instead of the DHF solution, a solution mixture of sulfuric acid and water or the like may also be used.

In the fifth cleaning method of the first embodiment, as shown in Table 1, the substrate is immersed in the DHF solution containing hydrofluoric acid at a concentration of, e.g., 0.0008 wt % for 2 minutes at room temperature, immersed in the aqueous $O_3$ containing ozone at a concentration of, e.g., 5.0 ppm for 3 minutes at room temperature, and then clean dried.

In the sixth cleaning method of the first embodiment, as shown in Table 1, the substrate is immersed in the DHF solution containing hydrofluoric acid at a concentration of, e.g., 0.0008 wt % for 2 minutes at room temperature, immersed in the aqueous $O_3$ containing ozone at a concentration of, e.g., 5.0 ppm for 3 minutes at room temperature, immersed in the TMAH solution containing tetramethyl ammonium hydroxide at a concentration of, e.g., 2.0 wt % for 1 minute at room temperature, and then clean dried.

In the seventh cleaning method of the comparative example, as shown in Table 1, the substrate is immersed in the SPM solution containing sulfuric acid (at a concentration of 98 wt %) and aqueous hydrogen peroxide (at a concentration of 30 wt %) at a 1:4 volume ratio for 10 minutes at a temperature of 80° C. and rinsed with pure water for 5 minutes. Subsequently, the substrate is immersed in the APM solution containing aqueous ammonia (at a concentration of 29 wt %), aqueous hydrogen peroxide (at a concentration of 30 wt %), and water at a 1:1:5 volume ratio for 5 minutes at a temperature of 70° C., rinsed with pure water for 5 minutes, and then clean dried.

Table 2 shows etching rates for tungsten when a silicon substrate on which a tungsten film having a thickness of 10 nm has been deposited with a silicon oxide film having a thickness of 10 nm interposed therebetween is cleaned in accordance with the individual cleaning methods shown in Table 1 (except for the sixth cleaning method of the first embodiment). The etching rates for tungsten are determined based on variations in the sheet resistance of tungsten after cleaning.

TABLE 2

| No. | Sheet Resistance of Tungsten before Cleaning ($\Omega/\square$) | Sheet Resistance of Tungsten after Cleaning ($\Omega/\square$) | Etching Rate for Tungsten (nm/min) |
|---|---|---|---|
| 1 | 21.21 | 21.56 | 0.17 |
| 2 | 21.72 | 21.90 | 0.03 |
| 3 | 21.74 | 22.12 | 0.09 |
| 4 | 21.69 | 21.95 | 0.13 |
| 5 | 21.62 | 22.06 | 0.04 |
| 7 | 1.22 | — | 6.67 or more |

As shown in Table 2, the etching rate for tungsten when the seventh cleaning method of the comparative example is as high as 6.67 nm/min or more, while the respective etching rates for tungsten when the first to fifth cleaning methods of the first embodiment are used are 0.17 nm/min, 0.03 nm/min, 0.09 nm/min, 0.13 nm/min, and 0.04 nm/min, which are extremely small.

Table 3 shows the roughness (extremely small projections and depressions of a surface of the substrate) of the silicon substrate when the silicon substrate in a bare silicon state is cleaned in accordance with the first to fourth cleaning methods shown in Table 1. For comparison, Table 3 also shows the roughness of the silicon substrate at the time of shipment from the manufacturer, i.e., before cleaning. As shown in Table 3, the concentration of the cleaning solution in accordance with the fourth cleaning method has been adjusted to be higher than the value shown in Table 1 and the immersion time in the cleaning solution in accordance with the second to fourth cleaning methods has been adjusted to be longer than the values shown in Table 1. To bring the silicon substrate into the bare silicon state, a natural oxide film on the silicon substrate is removed by using the DHF solution before the first to fourth cleaning methods are implemented such that the silicon surface is exposed. The roughness of the silicon substrate was measured by using an AFM (atomic force microscope) and evaluated by a Rms (root mean square).

TABLE 3

| No. | Concentration of Cleaning Solution | Immersion Time in Cleaning Solution (min) | Roughness of Silicon Substrate (nm) |
|---|---|---|---|
| 1 | Same as in Table 1 | Same as in Table 1 | 0.35 |
| 2 | Same as in Table 1 | 10 min | 0.188 |
| 3 | Same as in Table 1 | 5 min | 3.4 |
| 4 | 0.025 wt % | 3 min | 0.186 |
| at Time of Shipment from Manufacturer (before Cleaning) | | | 0.182 |

As shown in Table 3, when the second or fourth cleaning method of the first embodiment is used, the roughness of the silicon substrate is barely increased compared with that before cleaning. When the first or third cleaning method of the first embodiment is used, by contrast, the roughness of the silicon substrate is slightly increased compared with that before cleaning. It is to be noted that the first or third cleaning method of the first embodiment can suppress an increase in the roughness of the silicon substrate by adjusting the concentration of the cleaning solution used in the cleaning method to be lower than the value shown in Table 1.

Table 4 shows the result of removing particles, resist residue, or the like when $BF^{2+}$ ions were implanted, with an energy of 20 KeV and at a dose of $5 \times 10^{15}$ cm$^{-2}$, into a silicon substrate on which a silicon oxide film with a thickness of 10 nm had been formed by thermal oxidation by using a resist pattern formed on the silicon oxide film as a mask. After the ion implantation, the resist pattern was removed by ashing and the silicon substrate was cleaned in accordance with the individual cleaning methods shown in Table 1. It is to be noted that the results of removing particles, resist residue, or the like are shown by using the number of defects displayed before cleaning and the number of defects displayed after cleaning, which were measured by using a KLA defect inspection system. Specifically, the results of removing particles, resist residue, or the like are more satisfactory as the number of defects displayed after cleaning is smaller than the number of defects displayed before cleaning.

TABLE 4

| No. | Number of Defects Displayed before Cleaning | Number of Defects Displayed after Cleaning |
|---|---|---|
| 1 | 55034 | 20 |
| 2 | 53024 | 144 |
| 3 | 51235 | 25 |
| 4 | 48025 | 32 |
| 5 | 54362 | 22 |
| 6 | 51231 | 10 |
| 7 | 49648 | 54 |

As shown in Table 4, the respective results of removing particles, resist residue, or the like when the first to sixth cleaning methods of the first embodiment were used are eminently good.

Referring to FIGS. 1(a) to 1(d), a description will be given to the case where a polymetal gate electrode containing tungsten is formed on a substrate and then the substrate is cleaned in accordance with the individual cleaning methods shown in Table 1.

First, as shown in FIG. 1(a), a gate oxide film 12 is formed on a silicon substrate 11 by thermal oxidation. Then, a polysilicon film 13A, a tungsten nitride film 13B, and a tungsten film 13C each as the materials of the polymetal gate electrode are deposited successively on the gate oxide film 12, followed by a silicon nitride film 14 deposited on the tungsten film 13C. Subsequently, a resist pattern 15 covering a region in which a gate electrode is to be formed is formed on the silicon nitride film 14.

Next, as shown in FIG. 1(b), dry etching is performed sequentially with respect to the silicon nitride film 14, the tungsten film 13C, the tungsten nitride film 13B, and the polysilicon film 13A by using the resist pattern 15 as a mask, thereby forming the polymetal gate electrode 13 composed of the polysilicon film 13A, the tungsten nitride film 13B, and the tungsten film 13C on the silicon substrate 11 with the gate oxide film 12 interposed therebetween.

Next, as shown in FIG. 1(c), the resist pattern 15 is removed by ashing.

Next, the silicon substrate 11 is cleaned in accordance with the first cleaning method of the first embodiment shown in Table 1 to remove resist residue, particles, a polymer (dry-etch polymer), or the like.

Thereafter, the same steps are performed repeatedly in accordance with the second to sixth cleaning methods of the first embodiment and the seventh cleaning method of the comparative example shown in Table 1.

As a result of using the first to sixth cleaning methods of the first embodiment, the tungsten nitride film 13B and the tungsten film 13C each composing the polymetal gate electrode 13 were barely dissolved, as shown in FIG. 1(d).

In the case of using the seventh cleaning method of the comparative example, by contrast, the tungsten nitride film 13B and the tungsten film 13C composing the polymetal gate electrode 13 were dissolved, though they are not depicted.

Table 5 shows the results of removing the particles, dry-etch polymer, or the like resulting from the foregoing dry-etching process (see FIG. 1(b)) when the individual cleaning methods shown in Table 1 were used. It is to be noted that the results of removing the particles, dry-etch polymer, or the like are shown by using the number of defects displayed before cleaning and the number of defects displayed after cleaning, which were measured by using the KLA defect inspection system. Specifically, the results of removing the particles, dry-etch polymer, or the like are more satisfactory as the number of defects displayed after cleaning is smaller than the number of defects displayed before cleaning.

TABLE 5

| No. | Number of Defects Displayed before Cleaning | Number of Defects Displayed after Cleaning |
|---|---|---|
| 1 | 35213 | 54 |
| 2 | 33214 | 120 |
| 3 | 34862 | 78 |
| 4 | 31583 | 300 |
| 5 | 31699 | 63 |
| 6 | 32143 | 35 |
| 7 | 31598 | 50000 or more |

As shown in Table 5, the result of removing the particles, dry-etch polymer, or the like when each of the first to sixth cleaning methods of the first embodiment was used is eminently good, while the result of removing the particles, dry-etch polymer, or the like when the seventh cleaning method of the comparative example was used is extremely bad due to the dissolution of the tungsten nitride film or the tungsten film.

When the fourth cleaning method of the first embodiment (cleaning using the DHF solution) is used, water drops remaining on the substrate or adhering thereto after the clean-drying process tend to produce stains (water marks). However, the production of the stains can be suppressed by using IPA (isopropyl alcohol) vapor for drying in the fourth cleaning method of the first embodiment.

Table 6 shows the overall cleaning ability of each of the first to fourth cleaning methods of the first embodiment and the seventh cleaning method of the comparative example shown in Table 1. It is to be noted that the overall cleaning ability has been evaluated as a result of evaluating each of the first to fourth cleaning methods and the seventh cleaning method regarding individual evaluation items, which are specifically: Tungsten-Dissolution Preventing Ability; Roughness Preventing Ability; Resist-Residue Removing Ability (including Particle Removing Ability); Polymer (Dry-Etch Polymer) Removing Ability (including Particle Removing Ability); and Stain Preventing Ability. The results of individual evaluations are shown on a three-level scale (○: Very Good, Δ: Good, X: Bad).

TABLE 6

| No. | Tungsten Dissolution Preventing Ability | Roughness Preventing Ability | Resist-Residue Removing Ability | Polymer Removing Ability | Stain Preventing Ability | Overall Cleaning Ability |
|---|---|---|---|---|---|---|
| 1 | ◯ | ◯ | ◯ | ◯ | ◯ | ◯ |
| 2 | ◯ | ◯ | ◯ | ◯ | ◯ | ◯ |
| 3 | ◯ | Δ | ◯ | ◯ | ◯ | ◯ |
| 4 | ◯ | ◯ | ◯ | ◯ | Δ | ◯ |
| 7 | X | ◯ | ◯ | ◯ | ◯ | X |

As shown in Table 6, the overall cleaning ability of each of the first to fourth cleaning methods of the first embodiment is eminently good.

Thus, since the first embodiment cleans an electronic device by using a cleaning solution composed of an acidic or alkaline solution which does not substantially contain aqueous hydrogen peroxide, such as a TMAH solution, aqueous $O_3$, aqueous $NH_4OH$, or a DHF solution, the etching rate for tungsten can be reduced significantly compared with the case where a cleaning solution containing aqueous hydrogen peroxide is used and the particles, resist residue, polymer, or the like can be removed reliably. This ensures cleaning of an electronic device, while preventing the dissolution of tungsten contained in a component of the electronic device, thereby providing an electronic device with high reliability.

Although the first embodiment has used the silicon substrate as the substrate for the electronic device, an insulating substrate or the like may also be used instead of the silicon substrate.

Although the first embodiment has used the polymetal gate electrode composed of the multilayer film consisting of the polysilicon film and the tungsten film as the component of the electronic device, it is not limited thereto. A metal gate electrode composed of a tungsten film or the like may also be used instead of the polymetal gate electrode.

Although the first embodiment has used tungsten (W) as the refractory metal contained in the component of the electronic device, it is not limited thereto. Instead of tungsten, there may also be used a refractory metal such as Mo or Ta, a silicide film of W, Mo, Ta, or the like such as $WSi_x$, $MoSi_x$, $TaSi_x$, or the like, or a nitride of W, Mo, Ta, or the like such as $WN_x$, MoN, TaN, or the like.

In the first embodiment, the cleaning solution composed of the aqueous $NH_4OH$, the DHF solution, or the solution mixture of sulfuric acid and water preferably contains ozone. This ensures a significant reduction in the etching rate for tungsten and more positive removal of particles, resist residue, a polymer, or the like compared with the case where a cleaning solution containing aqueous hydrogen peroxide is used.

In the first embodiment, it is also possible to clean the electronic device having the component containing a refractory metal such as tungsten by sequentially using two or more of the TMAH solution, the aqueous $O_3$, the aqueous $NH_4OH$, the aqueous $NH_4OH$ containing ozone, the DHF solution, the DHF solution containing ozone, the solution mixture of sulfuric acid and water, and the solution mixture of sulfuric acid and water containing ozone. In particular, the following effect is achievable if a substrate formed with a polymetal gate electrode or a metal gate electrode is cleaned by sequentially using the first cleaning solution composed of the DHF solution, the second cleaning solution composed of the aqueous $O_3$, and the third cleaning solution composed of the TMAH solution in accordance with the sixth cleaning method of the first embodiment shown in Table 1. After the particles, resist residue, polymer, or the like are removed, together with the oxide film formed on the substrate or on the refractory metal film or the like composing the gate electrode, under the lift-off effect or the like exerted by the DHF solution, an oxide film for preventing stains is formed on the substrate by the aqueous $O_3$ and then remaining microfine particles are removed by the TMAH solution, so that the reliability of the electronic device is further improved.

Embodiment 2

A method of cleaning an electronic device and a method of fabricating the same according to a second embodiment of the present invention will be described with reference to FIGS. 2(a) to 2(c) and 3(a) to 3(c).

The second embodiment is characterized in that the sixth cleaning method of the first embodiment (hereinafter referred to as three-step cleaning) is applied to the process of fabricating a complementary semiconductor device (CMOS).

First, as shown in FIG. 2(a), device isolations 22 composed of STI structures are formed in a silicon substrate 21, thereby defining an n-type MOSFET formation region Rnmos and a p-type MOSFET formation region Rpmos. Then, a gate insulating film 23 composed of a silicon oxide film, a polysilicon film 24, a barrier metal film 25, a refractory metal film 26 composed of, e. g., a tungsten film, and a silicon nitride film 27 are deposited successively on the silicon substrate 21. Subsequently, the silicon nitride film 27 is etched by using a resist pattern (not shown) covering a gate electrode formation region and then the resist pattern is removed by ashing. Thereafter, the refractory metal film 26, the barrier metal film 25, the polysilicon film 24, and the gate insulating film 23 are etched by using the patterned silicon nitride film 27 (hard mask). As a result, a first gate electrode 28 and a second gate electrode 29, each composed of the polysilicon film 24, the barrier metal film 25, and the refractory metal film 26, are formed on the n-type MOSFET formation region Rnmos and on the p-type MOSFET formation region Rpmos, respectively.

Next, as shown in FIG. 2(b), a first resist pattern 30 covering the p-type MOSFET formation region Rpmos including the second gate electrode 29 is formed. Then, an n-type impurity such as arsenic is implanted into the silicon substrate 21 by using the first resist pattern 30 and the first gate electrode 28 as a mask, whereby a first source region 31 and a first drain region 32 are formed in the n-type MOSFE formation region Rnmos.

Next, as shown in FIG. 2(c), the first resist pattern 30 is removed by ashing using an oxygen plasma. At that time, a thin oxide film 33 is formed on a surface of the silicon substrate 21 or on respective surfaces of a polysilicon film 24 and the refractory metal film 26 composing the second gate electrode 29, while particles 34 remain on the device isolations 22 or on the side faces of the second gate electrode 29. Since the edge portions of the first resist pattern 30 lying on the device isolations 22 were particularly damaged during the implantation of arsenic described above, the particles 34 remain in a particularly large quantity on the isolations 22.

The second embodiment removes the particles 34 together with the oxide film 33 by removing the first resist pattern 30 by ashing and then removing the oxide film 33 by using the three-step cleaning in accordance with the present invention as shown in FIG. 3(a), i.e., specifically by using the first cleaning solution composed of the DHF solution, the second cleaning solution composed of the aqueous $O_3$, and the third cleaning solution composed of the TMAH solution. This allows purification of the surface of the silicon substrate 21.

Next, as shown in FIG. 3(b), a second resist pattern 35 covering the n-type MOSFET formation region Rnmos including the first gate electrode 28 is formed. Then, a p-type impurity such as boron is implanted into the silicon substrate 21 by using the second resist pattern 35 and the second gate electrode 29 as a mask. As a result, a second source region 36 and a second drain region 37 are formed in the p-type MOSFET formation region Rpmos.

Next, as shown in FIG. 3(c), the second resist pattern 35 is removed by ashing using an oxygen plasma and then the surface of the silicon substrate 21 is purified by using the three-step cleaning in accordance with the present invention, as described above.

As a result of performing the process steps described above, a CMOS composed of the n-type MOSFET and the p-type MOSFET is completed.

Since the second embodiment has cleaned the substrate formed with the gate electrodes by sequentially using the first cleaning solution composed of the DHF solution, the second cleaning solution composed of the aqueous $O_3$, and the third cleaning solution composed of the TMAH solution, the etching rate for a refractory metal can be reduced significantly compared with the case where a cleaning solution containing aqueous hydrogen peroxide is used and particles, resist residue, a polymer, or the like can be removed thoroughly. Since the second embodiment ensures cleaning of the substrate, while preventing the dissolution of a refractory metal contained in the gate electrodes, it provides an electronic device with high reliability.

Since the second embodiment removes particles, resist residue, a polymer, or the like together with the oxide film formed on the substrate or on the refractory metal film or the like under the lift-off effect or the like exerted by the cleaning process using the DHF solution (first cleaning solution), forms the oxide film for preventing the production of stains (water marks) on the substrate by the cleaning process using the aqueous $O_3$ (second cleaning solution), and removes remaining microfine particles by the cleaning process using the TMAH solution (third cleaning solution), the reliability of the electronic device is further improved.

Although the second embodiment has used the silicon substrate as the substrate for the electronic device, an insulating substrate or the like may also be used instead of the silicon substrate.

Although the second embodiment has used the polymetal gate electrodes each composed of the multilayer film consisting of the polysilicon film and the tungsten film as the component of the electronic device, it is not limited thereto. Metal gate electrodes each composed of a tungsten film or the like may also be used instead of the polymetal gate electrodes.

Although the second embodiment has used tungsten (W) as the refractory metal contained in the component of the electronic device, it is not limited thereto. Instead of tungsten, there may also be used a refractory metal such as Mo or Ta, a silicide film of W, Mo, Ta, or the like such as $WSi_x$, $MoSi_x$, $TaSi_x$, or the like, or a nitride of W, Mo, Ta, or the like such as $WN_x$, MoN, TaN, or the like.

What is claimed is:

1. A method of cleaning an electronic device, the method comprising the step of:
    cleaning an electronic device having a component containing a refractory metal by sequentially using a first cleaning solution composed of a solution mixture of hydrofluoric acid and water, a second cleaning solution composed of ozone-containing water, and a third cleaning solution composed of a solution mixture of tetramethyl ammonia hydroxide and water.

2. A method of fabricating an electronic device, the method comprising the steps of:
    forming, on a substrate, a multilayer film including at least a refractory metal film;
    performing dry etching on the multilayer film by using a mask pattern covering a gate electrode formation region of a first-conductivity-type transistor formation region and thereby forming a gate electrode composed of the multilayer film;
    implanting a second-conductivity-type impurity into the first-conductivity-type transistor formation region by using the gate electrode and a resist pattern covering a second-conductivity-type transistor formation region as a mask; and
    removing the resist pattern by ashing and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water.

3. The method of claim 2, wherein the gate electrode has a polymetal gate electrode structure or a metal gate electrode structure.

4. A method of fabricating an electronic device, the method comprising the steps of:
    forming a refractory metal film on a substrate;
    performing dry etching with respect to the refractory metal film by using a resist pattern covering a gate electrode formation region and thereby forming a gate electrode composed of the refractory metal film; and
    removing the resist pattern by ashing and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water.

5. The method of claim 4, wherein the gate electrode has a polymetal gate electrode structure or a metal gate electrode structure.

6. A method of fabricating an electronic device, the method comprising the steps of:
    forming a first electrode structure and a second electrode structure on a first-conductivity-type MOSFET formation region and a second-conductivity-type MOSFET formation region of a substrate, respectively;
    implanting a second-conductivity-type impurity into the first-conductivity-type MOSFET formation region by using, as a mask, the first electrode structure and a first resist pattern covering the second-conductivity-type MOSFET formation region including the second electrode structure to form a first source region and a first drain region in the first-conductivity-type MOSFET formation region;
    removing the first resist pattern by ashing using an oxygen plasma and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water;

implanting a first-conductivity-type impurity into the second-conductivity-type MOSFET formation region by using, as a mask, the second electrode structure and a second resist pattern covering the first-conductivity-type MOSFET formation region including the first electrode structure to form a second source region and a second drain region in the second-conductivity-type MOSFET formation region; and removing the second resist pattern by ashing using an oxygen plasma and cleaning the substrate by sequentially using the first cleaning solution, the second cleaning solution and the third cleaning solution, each of the first and second electrode structures having a multilayer structure composed of a polysilicon film and a refractory metal film.

7. A method of fabricating an electronic device, the method comprising the steps of:

forming a first electrode structure and a second electrode structure on a first-conductivity-type MOSFET formation region and a second-conductivity-type MOSFET formation region of a substrate, respectively;

implanting a second-conductivity-type impurity into the first-conductivity-type MOSFET formation region by using, as a mask, the first electrode structure and a first resist pattern covering the second-conductivity-type MOSFET formation region including the second electrode structure to form a first source region and a first drain region in the first-conductivity-type MOSFET formation region;

removing the first resist pattern by ashing using an oxygen plasma and cleaning the substrate by sequentially using a first cleaning solution composed of a solution mixture of hydrofluoric acid and water, a second cleaning solution composed of ozone-containing water, and a third cleaning solution composed of a solution mixture of tetramethyl ammonium hydroxide and water;

implanting a first-conductivity-type impurity into the second-conductivity-type MOSFET formation region by using, as a mask, the second electrode structure and a second resist pattern covering the first-conductivity-type MOSFET formation region including the first electrode structure to form a second source region and a second drain region in the second-conductivity-type MOSFET formation region; and removing the second resist pattern by ashing using an oxygen plasma and cleaning the substrate by sequentially using the first cleaning solution, the second cleaning solution and the third cleaning solution, each of the first and second electrode structures containing a metal.

8. The method of claim 1, wherein the refractory metal is tungsten.

* * * * *

UNITED STATES PATENT AND TRADEMARK OFFICE
CERTIFICATE OF CORRECTION

PATENT NO. : 6,664,196 B1 Page 1 of 1
DATED : December 16, 2003
INVENTOR(S) : Yukihisa Wada et al.

It is certified that error appears in the above-identified patent and that said Letters Patent is hereby corrected as shown below:

<u>Title page,</u>
Item [56], References Cited, U.S. PATENT DOCUMENTS, insert
-- 6,296,714 10/2001 Matsuo et al. --;
FOREIGN PATENT DOCUMENTS, insert
-- JP 10-209100 8/1998 --;
  JP 09-260328 10/1997 --;

Signed and Sealed this

Eighth Day of June, 2004

JON W. DUDAS
*Acting Director of the United States Patent and Trademark Office*